(12) United States Patent
Wu et al.

(10) Patent No.: US 10,897,819 B2
(45) Date of Patent: Jan. 19, 2021

(54) DISPLAY PANEL, FLEXIBLE CIRCUIT BOARD AND DISPLAY DEVICE

(71) Applicant: Xiamen Tianma Micro-Electronics Co., Ltd., Xiamen (CN)

(72) Inventors: Huangyao Wu, Xiamen (CN); Shumao Wu, Xiamen (CN); Guochang Lai, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/561,534

(22) Filed: Sep. 5, 2019

(65) Prior Publication Data

US 2020/0214128 A1 Jul. 2, 2020

(30) Foreign Application Priority Data

Dec. 28, 2018 (CN) .......................... 2018 1 1622332

(51) Int. Cl.
*H05K 1/11* (2006.01)
*H01L 23/498* (2006.01)
*H01L 27/12* (2006.01)
*H05K 1/14* (2006.01)
*H05K 3/36* (2006.01)

(52) U.S. Cl.
CPC ........ *H05K 1/111* (2013.01); *H01L 23/49838* (2013.01); *H01L 27/124* (2013.01); *H05K 1/118* (2013.01); *H05K 1/147* (2013.01); *H05K 3/361* (2013.01); *H05K 2201/094* (2013.01);

(Continued)

(58) Field of Classification Search
CPC . H01L 23/49838; H01L 27/124; H05K 3/361; H05K 2201/09418; H05K 2201/094; H05K 2201/10128
See application file for complete search history.

(56) References Cited

U.S. PATENT DOCUMENTS 5,951,304 A * 9/1999 Wildes .................. H05K 1/111
439/67
9,591,754 B2 3/2017 Lee
(Continued)

FOREIGN PATENT DOCUMENTS

CN 104123902 A 10/2014
KR 20150117999 A 10/2015

*Primary Examiner* — Errol V Fernandes
*Assistant Examiner* — Jeremy J Joy
(74) *Attorney, Agent, or Firm* — Anova Law Group PLLC

(57) ABSTRACT

A display panel, a flexible circuit board and a display device are provided. The display panel includes a substrate, and at least one row of a plurality of input pads including at least one first-input pad disposed in the middle of the input pads and a plurality of second-input pads disposed on both sides of the first input pad. Each input pad includes a first end and a second end that are oppositely disposed, and a spacing between any adjacent two input pads includes a first spacing between adjacent two first ends and a second spacing between adjacent two second ends. The first spacing and the second spacing between any adjacent two second-input pads are not equal. Along a direction from the first-input pad to the second-input pad, starting from adjacent first-input and second-input pads, the first spacing and the second spacing successively and gradually increases, respectively.

20 Claims, 8 Drawing Sheets

(52) U.S. Cl.
CPC .............. *H05K 2201/09418* (2013.01); *H05K 2201/10128* (2013.01); *H05K 2203/166* (2013.01)

(56) References Cited

U.S. PATENT DOCUMENTS

| | | | |
|---|---|---|---|
| 2014/0321088 A1* | 10/2014 | Bae .......................... | H05K 7/06 361/767 |
| 2015/0103500 A1* | 4/2015 | Bae .......................... | H01L 24/06 361/749 |
| 2015/0108480 A1* | 4/2015 | Xu .................... | G02F 1/136259 257/59 |
| 2015/0366049 A1* | 12/2015 | Lee ....................... | H01L 27/124 361/749 |
| 2016/0104692 A1* | 4/2016 | Lee .................... | G02F 1/13452 257/773 |
| 2018/0082929 A1* | 3/2018 | Lai .................... | H01L 23/49855 |
| 2018/0122758 A1* | 5/2018 | Chen .................. | G02F 1/13452 |
| 2019/0139481 A1* | 5/2019 | Zhang ................. | G09G 3/2096 |
| 2019/0281699 A1* | 9/2019 | Bae ........................ | H05K 1/118 |
| 2019/0305070 A1* | 10/2019 | Lee ....................... | H05K 3/323 |

\* cited by examiner

DISPLAY PANEL, FLEXIBLE CIRCUIT BOARD AND DISPLAY DEVICE

CROSS-REFERENCES TO RELATED APPLICATIONS

This application claims the priority of Chinese patent application No. 201811622332.8, filed on Dec. 28, 2018, the entirety of which is incorporated herein by reference.

FIELD

The present disclosure generally relates to the field of display technology and, more particularly, relates to a display panel, a flexible circuit board and a display device.

BACKGROUND

In the field of display technology, to realize the display function of the display panel, electrical signals have to be provided by a main driver chip to various circuit wires disposed in the display panel. The main driver chip is often electrically connected to the circuit wires disposed in the display panel through a flexible circuit board. Input pads are often disposed on the display panel, and output pads are often disposed on the flexible circuit board. The input pads are bonded and connected to the output pads in a one-to-one correspondence by anisotropic conductive adhesive. In a bonding fabrication process, a thermal expansion coefficient of the flexible circuit board is different from a thermal expansion coefficient of a substrate of the display panel, which causes a misalignment between an input pad and an output pad during the bonding process, and affects the bonding yield.

Therefore, how to provide a display panel, a flexible circuit board and a display device capable of reducing the occurrence of the misalignment phenomenon in the bonding process is an urgent issue to be solved. The disclosed display panel, flexible circuit board and display device are directed to solve one or more problems set forth above and other problems.

SUMMARY

One aspect of the present disclosure provides a display panel. The display panel includes a substrate, and at least one row of a plurality of input pads arranged along a first direction, disposed in a bonding region of the substrate. The plurality of input pads includes at least one first-input pad and a plurality of second-input pads. A first-input pad of the at least one first-input pad is extended along a second direction, and the second direction intersects the first direction. The at least one first-input pad forms a first-input pad group. The plurality of second-input pads constitutes second-input pad groups, and two of the second-input pad groups are disposed on both sides of the first-input pad group, respectively. Each input pad of the plurality of input pads includes a first end and a second end that are oppositely disposed in a respective extension direction thereof, and a spacing between any adjacent two input pads of the plurality of input pads includes a first spacing and a second spacing. The first spacing is a spacing between two first ends of the adjacent two input pads in the first direction. The second spacing is a spacing between two second ends of the adjacent two input pads in the first direction. In any one second-input pad group, the first spacing and the second spacing between adjacent two second-input pads are not equal. In the first direction, along a direction from the first-input pad group to the second-input pad group, starting from adjacent first-input and second-input pads, the first spacing successively and gradually increases, and the second spacing successively and gradually increases.

Another aspect of the present disclosure provides a flexible circuit board. The flexible circuit board includes a base, and at least one row of a plurality of output pads arranged along a first direction, disposed on a side of the base. The plurality of output pads include at least one first-output pad and a plurality of second-output pads. A first-output pad of the at least one first-output pad is extended along a second direction, and the second direction intersects the first direction. The at least one first-output pad forms a first-output pad group. The plurality of second-output pads constitutes second-output pad groups, and two of the second-output pad groups are disposed on both sides of the first-output pad group, respectively. Each output pad of the plurality of output pads includes a first end and a second end that are oppositely disposed in respective extension direction thereof, and a spacing between any adjacent two output pads of the plurality of output pads includes a first spacing and a second spacing. The first spacing is a spacing between two first ends of the adjacent two output pads in the first direction. The second spacing is a spacing between two second ends of the adjacent two output pads in the first direction. In any one second-output pad group, the first spacing and the second spacing between adjacent two second-output pads are not equal. In the first direction, along a direction from the first-output pad group to the second-output pad group, starting from adjacent first-output and second-output pads, the first spacing successively and gradually increases, and the second spacing successively and gradually increases.

Another aspect of the present disclosure provides a display device. The display device includes a display panel. The display panel includes a substrate, and at least one row of a plurality of input pads arranged along a first direction, disposed in a bonding region of the substrate. The plurality of input pads includes at least one first-input pad and a plurality of second-input pads. A first-input pad of the at least one first-input pad is extended along a second direction, and the second direction intersects the first direction. The at least one first-input pad forms a first-input pad group. The plurality of second-input pads constitutes second-input pad groups, and two of the second-input pad groups are disposed on both sides of the first-input pad group, respectively. Each input pad of the plurality of input pads includes a first end and a second end that are oppositely disposed in a respective extension direction thereof, and a spacing between any adjacent two input pads of the plurality of input pads includes a first spacing and a second spacing. The first spacing is a spacing between two first ends of the adjacent two input pads in the first direction. The second spacing is a spacing between two second ends of the adjacent two input pads in the first direction. In any one second-input pad group, the first spacing and the second spacing between adjacent two second-input pads are not equal. In the first direction, along a direction from the first-input pad group to the second-input pad group, starting from adjacent first-input and second-input pads, the first spacing successively and gradually increases, and the second spacing successively and gradually increases.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
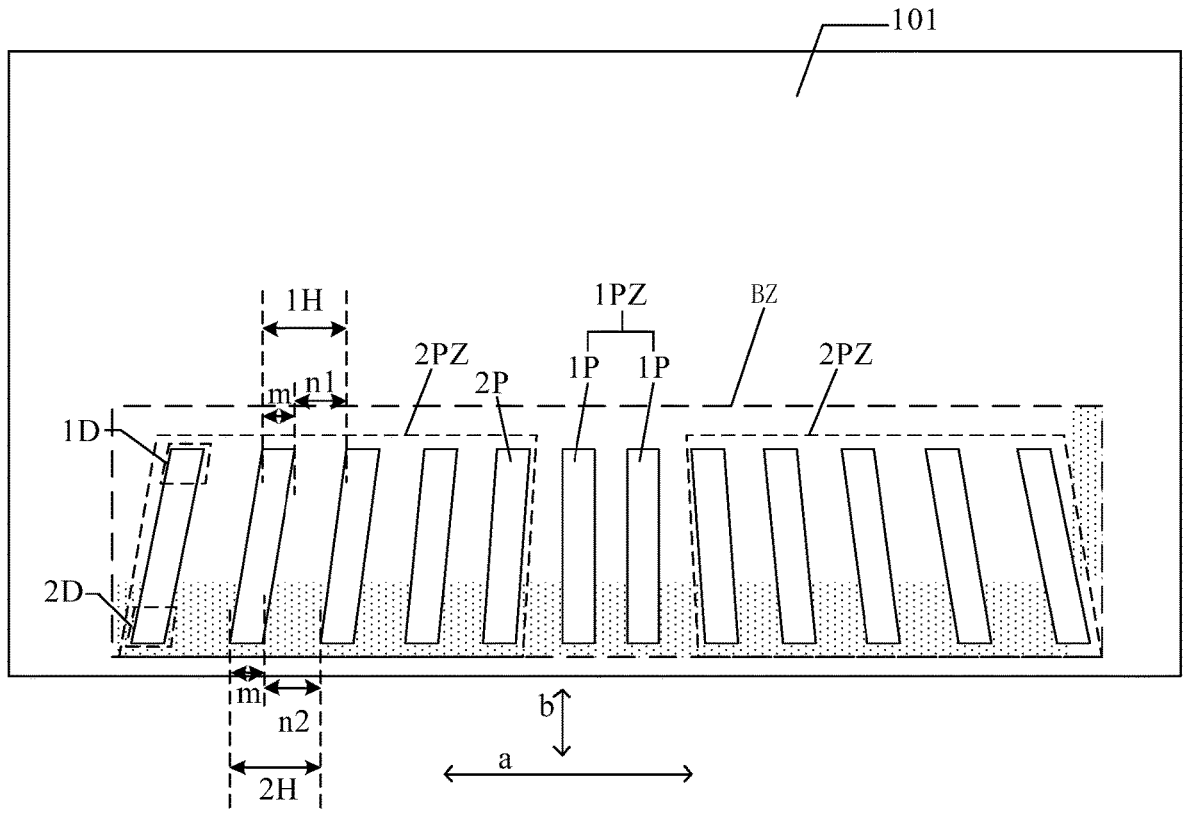
FIG. 1 illustrates a schematic illustrating an enlarged partial view of an exemplary display panel consistent with disclosed embodiments of the present disclosure.
Figure 2:
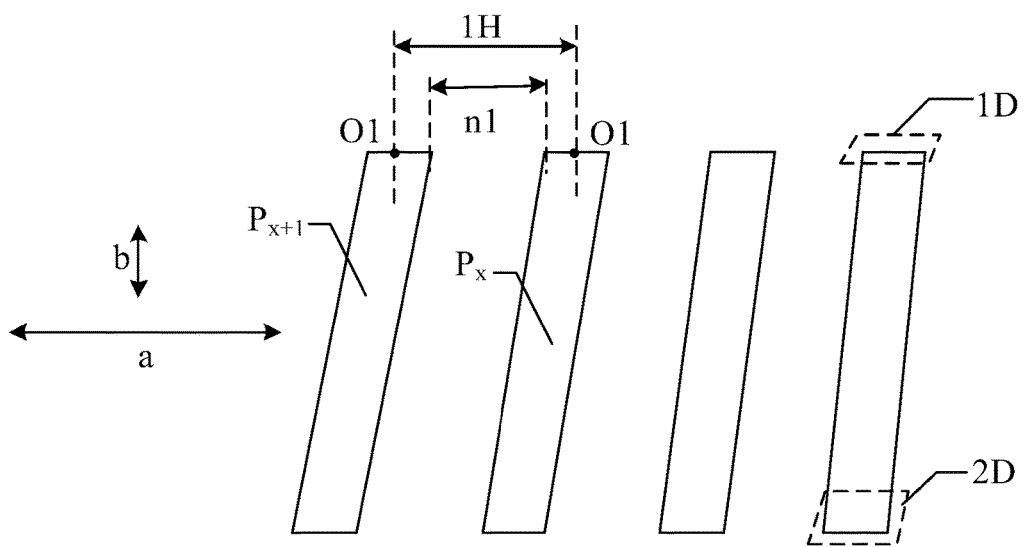
FIG. 2 illustrates a schematic diagram of an exemplary method for calculating spacing between input pads in a display panel consistent with disclosed embodiments of the present disclosure.
Figure 3:
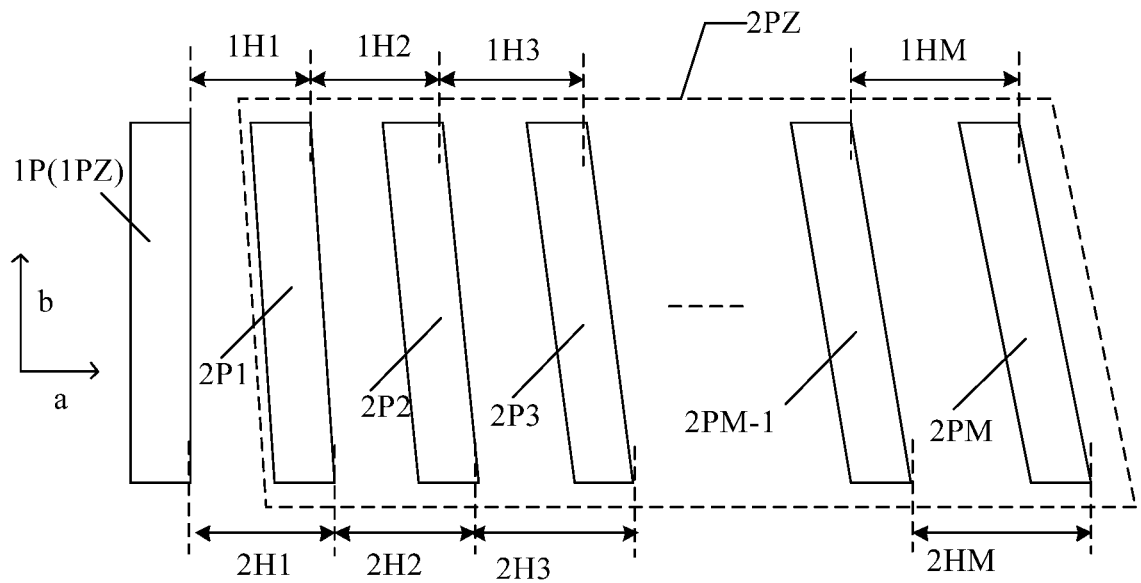
FIG. 3 illustrates a schematic diagram illustrating a change in spacing between input pads in an exemplary display panel consistent with disclosed embodiments of the present disclosure.

The present disclosure provides a display panel. FIG. 1 illustrates a schematic local zoom-in view of a display panel consistent with disclosed embodiments of the present disclosure; FIG. 2 illustrates a schematic diagram of a method for calculating spacing between input pads in the disclosed display panel; and FIG. 3 illustrates a schematic diagram illustrating a change in spacing between input pads in the disclosed display panel.

Referring to FIG. 1, the display panel may include a substrate 101, and at least one row of a plurality of input pads P arranged along a first direction 'a' disposed in a bonding region BZ of the substrate 101. FIG. 1 illustrates one row of input pads P for illustrative purposes. In one embodiment, the substrate 101 may be disposed with two rows of input pads P. In another embodiment, depending on the design requirements of the display panel, rows of input pads P may be disposed on different sides of the substrate.

The input pads P may include at least one first-input pad 1P and a plurality of second-input pads 2P. The first-input pad 1P may be extended along a second direction 'b', and the second direction 'b' may intersect the first direction 'a'. In one embodiment, the second direction 'b' may be perpendicular to the first direction 'a'. At least one first-input pad 1P may form a first-input pad group 1PZ. For illustrative purposes, FIG. 1 illustrates that the first-input pad group 1PZ includes two first-input pads 1P. The second-input pads 2P disposed on one side of the first-input pad group 1PZ may form a second-input pad group 2PZ, and two second-input pad groups 2PZ may be disposed on both sides of the first-input pad group 1PZ, respectively. A quantity of the second-input pads 2P in the second-input pad group 2PZ in FIG. 1 is merely a schematic representation for illustrative purposes.

Each input pad P may include a first end 1D and a second end 2D that are oppositely disposed in respective extension direction. A spacing between any adjacent two input pads P may include a first spacing 1H and a second spacing 2H. The first spacing 1H may be a spacing between the two first ends 1D of adjacent two input pads P in the first direction 'a', and the second spacing 2H may be a spacing between the two second ends 2D of adjacent two input pads P in the first direction 'a'. In any one second-input pad group 2PZ, the first spacing 1H and the second spacing 2H between adjacent two second-input pads 2P may not be equal.

FIG. 1 illustrates a method for calculating the spacing between adjacent two input pads P for illustrative purposes. The spacing between two input pads P may be defined as a sum of a width of one input pad P along the first direction 'a' and an interval distance between the two input pads P along the first direction 'a'. In other words, 1H=m+n1, where m is the width of one input pad P along the first direction 'a', and n1 is an interval distance between adjacent two first ends 1D along the first direction 'a'. Similarly, 2H=m+n2, where m is the width of one input pad P along the first direction 'a', and n2 is an interval distance between adjacent two second ends 2D along the first direction 'a'.

In one embodiment, referring to FIG. 2, the input pad P may include the first end 1D and the second end 2D. Adjacent two input pads $P_x$ and $P_{x-1}$ illustrated in FIG. 2 are used as an example for illustrative purposes, the spacing between the adjacent two input pads P may be defined as a distance between corresponding same positions of the adjacent two input pads. The first spacing 1H is used as an example for illustrative purposes, the first spacing 1H may be a distance between the two O1 of the two first ends 1D, where O1 is a center of an edge of the first end 1D in the first direction 'a'. In other words, $1H=n1+m_x/2+m_{x+1}/2$, where n1 is the interval distance between the two first ends 1D of the input pad $P_x$ and the input pad $P_{x+1}$, $m_x/2$ is half a length of the first end 1D of the input pad $P_x$ in the first direction 'a', and $m_{x+1}/2$ is half a length of the first end 1D of the input pad $P_{x+1}$ in the first direction 'a'. In the disclosed embodiments, the calculation of the spacing between adjacent two input pads may adopt one of the manner illustrated in FIG. 1 and the manner illustrated in FIG. 2, as long as it is ensured that a uniform calculation method is adopted when calculating the spacing between any adjacent two input pads.

In the first direction 'a', along a direction from the first-input pad group 1PZ to the second-input pad group 2PZ, starting from adjacent first-input pad 1P and second-input pad 2P, the first spacing 1H may successively and gradually increase, and the second spacing 2H may successively and gradually increase.

Referring to FIG. 3, along the direction from the first-input pad group 1PZ to the second-input pad group 2PZ disposed one side of the first-input pad group 1PZ, starting from a second-input pad 2P disposed adjacent to the first-input pad 1P, the input pads may successively include a first second-input pad 2P1, a second second-input pad 2P2, a third second-input pad 2P3, . . . to M–1$^{th}$ second-input pad 2PM-1, and to M$^{th}$ second-input pad 2PM. In other words, the second-input pad group 2PZ disposed the one side of the first-input pad group 1PZ may include a total M second-input pads 2P. Then, the first spacing 1H may successively include 1H1, 1H2, 1H3, . . . to 1HM, where 1H1<1H2<1H3< . . . <1HM, and correspondingly, the second spacing 2H may successively include 2H1, 2H2, 2H3 . . . to 2HM, where 2H1<2H2<2H3< . . . <2HM. Further, in the disclosed embodiments, 2H1≠1H1, 2H2≠1H2 . . . 2HM≠1HM.

In the disclosed display panel, along the direction from the first-input pad group to the second-input pad group, starting from the adjacent first-input and second-input pads, the first spacing may successively and gradually increase, and the second spacing may successively and gradually increase. In other words, along the direction from the first-input pad disposed in the middle of the plurality of input pads to the outside second-input pad, the spacing between adjacent two input pads may successively and gradually increase. In the disclosed embodiments, the second-input pads disposed on both sides of the first-input pad group may be successively and gradually expanded outwardly in a Chinese character-eight shape in a direction away from the first-input pad group. Further, the first spacing and the second spacing between the adjacent two second-input pads may not be equal. In other words, referring to FIG. 3, in the adjacent two second-input pads 2P (or adjacent first-input pad 1P and second-input pad 2P), along a direction from the first end 1D to the second end 2D, the spacing between the input pads may gradually change (FIG. 3 illustrates a case where the spacing gradually increases).

Figure 4:
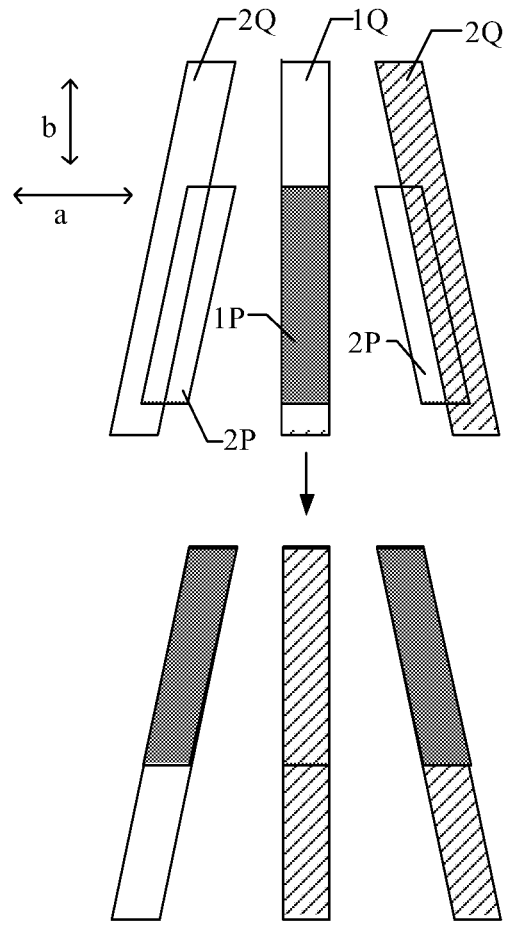
FIG. 4 illustrates a schematic diagram of an exemplary alignment adjustment mechanism between input pads in a display panel and output pads in a flexible circuit board consistent with disclosed embodiments of the present disclosure.

When the disclosed display panel is bonded to a flexible circuit board, the input pads may be aligned and bonded to the output pads in a one-to-one correspondence by adjusting relative positions of the input pads in the display panel with respect to the output pads in the flexible circuit board. FIG. 4 illustrates a schematic diagram of an alignment adjustment between the input pads in the display panel and output pads in the flexible circuit board consistent with disclosed embodiments of the present disclosure; and FIG. 5 illustrates a schematic diagram of another alignment adjustment between the input pads in the display panel and output pads in the flexible circuit board consistent with disclosed embodiments of the present disclosure.

Referring to FIG. 4, for illustrative purposes, the display panel may include one first-input pad 1P and two second-input pads 2P, and correspondingly, the flexible circuit board may include one first-output pad 1Q and two second-output pads 2Q. The input pads and the output pads may be arranged in the first direction 'a', and the first-input pad 1P and the first-output pad 1Q may be extended in the second direction 'b'. When performing an alignment, there may be a misalignment between an input pad and an output pad. Referring to FIG. 4, the second-output pads 2Q may be expanded outwardly with respect to the second-input pads 2P. In view of this, the flexible circuit board may be moved downward along the second direction 'b' illustrated in FIG. 4 with respect to the display panel, such that portions of the output pads that match the input pads may be aligned with the input pads.

Figure 5:
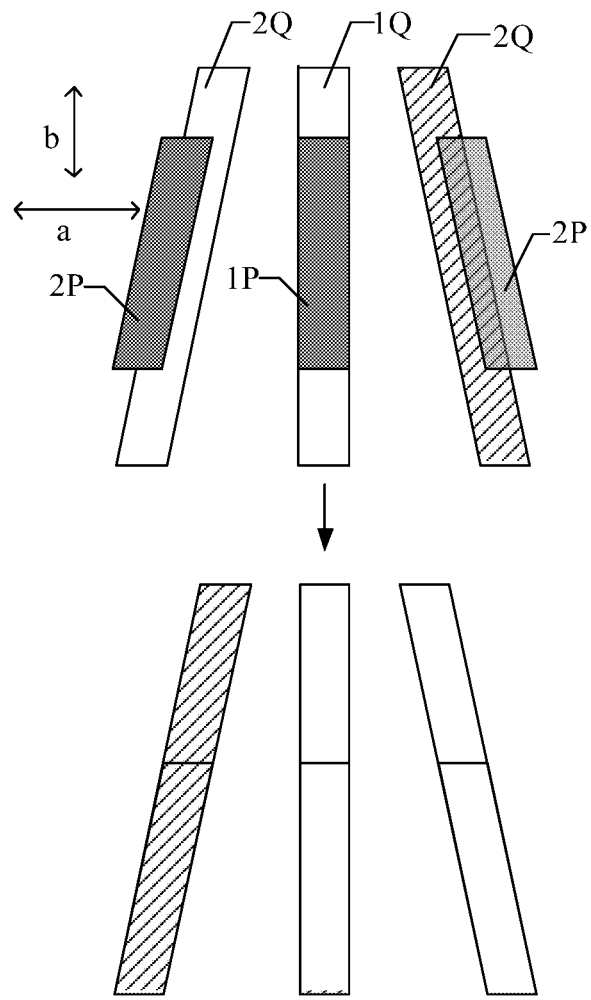
FIG. 5 illustrates a schematic diagram of another exemplary alignment adjustment mechanism between input pads in a display panel and output pads in a flexible circuit board consistent with disclosed embodiments of the present disclosure.

Referring to FIG. 5, for illustrative purposes, the display panel may include one first-input pad 1P and two second-input pads 2P, and correspondingly, the flexible circuit board may include one first-output pad 1Q and two second-output pads 2Q. The input pads and the output pads may be arranged in the first direction 'a', and the first-input pad 1P and the first-output pad 1Q may be extended in the second direction 'b'. When performing an alignment, there may be a misalignment between an input pad and an output pad. Referring to FIG. 5, the second-output pads 2Q may be retracted inwardly with respect to the second-input pads 2P. In view of this, the flexible circuit board may be moved upward along the second direction 'b' illustrated in FIG. 5 with respect to the display panel, such that portions of the output pads that match the input pads may be aligned with the input pads.

When the input pads and the output pads are misaligned in the first direction 'a' illustrated in one of FIG. 4 and FIG. 5, similarly, the flexible circuit board may be moved in the first direction 'a' with respect to the display panel to achieve the alignment between the output pads and the input pads.

The ambient temperature of the bonding process may be substantially high, and the substrate carrying the input pads may have a thermal expansion coefficient different from the base carrying the output pads, which may cause the spacing between adjacent input pads to have a variation amplitude different from the spacing between adjacent output pads. In the disclosed embodiments, along the direction from the first-input pad disposed in the middle to the outside second-input pad, the spacing may successively and gradually increase, and the interval distance between adjacent two input pads may gradually change along the extension direction of the input pad. The second-input pads may be gradually expanded outwardly with respect to the first-input pad, and the input pads may be substantially uniformly expanded as the substrate of the display panel is thermally expanded. In other words, the input pads in the disclosed embodiments may have an overall spacing variation trend in the expanded state consistent with an overall spacing variation trend before expansion.

In the process of bonding the display panel to the flexible circuit board, the one-to-one correspondence between the input pads and the output pads may be realized by adjusting the relative position of the flexible circuit board with respect to the display panel, i.e., up, down, left and right movement of the output pad with respect to the input pad. The spacing variation of the thermally expanded input pads in the disclosed display panel may match the spacing variation of the thermally expanded output pads in the flexible circuit board, which may substantially match the material and process tolerances in the bonding process, effectively reduce the misalignment between the input pads and the output pads, and improve the bonding yield.

For illustrative purposes, the second-input pads disposed on both sides of the first-input pad group in FIG. 1 and the following drawings are arranged in a regular Chinese character-eight shape as an example. The second-input pads disposed on both sides of the first-input pad group in the disclosed display panel may also be arranged in an inverted Chinese character-eight shape, which is not illustrated in the drawings.

In one embodiment, referring to FIG. 1, each second-input pad group 2PZ may have a same quantity of the second-input pads 2P. In other words, the second-input pads having a same quantity may be disposed on both sides of the first-input pad group. In view of such design, when performing the alignment between the input pads and the output pads, the first-input pad extended in the second direction may often be easily aligned with the first-output pad extended in the second direction. Because the second-input pads are arranged in a Chinese character-eight shape, when being aligned with the second-output pads that are also arranged in a Chinese character-eight shape, the second-input pads disposed on both sides of the first-input pad may be simultaneously aligned with the second-output pads disposed on both sides of the first-output pad, which may ensure a substantially large quantity of alignment reference positions, and ensure a substantially high alignment accuracy. In other words, two pairs of second-output pads and second-input pads, and the first-input pad and the first-output pad may be reference positions, and the alignment may be completed when the two pairs of second-output pads and second-input pads sides as well as the first-input pad and the first-output pad are accurate.

Figure 6:
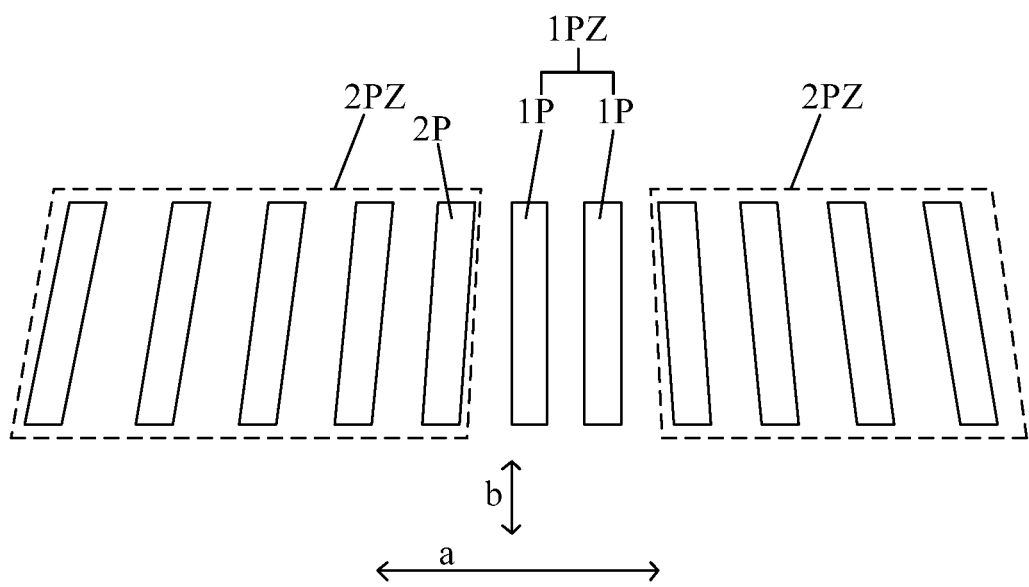
FIG. 6 illustrates a schematic diagram of a local structure of an exemplary display panel consistent with disclosed embodiments of the present disclosure.

FIG. 6 illustrates a schematic diagram of a local structure of a display panel consistent with disclosed embodiments of the present disclosure. In one embodiment, referring to FIG. 6, each second-input pad group 2PZ may have a different quantity of the second-input pads 2P. For illustrative purposes, FIG. 6 merely illustrates a case where the first-input pad group 1PZ includes two first-input pads 1P. The difference between the quantity of the second-input pads 2P in each second-input pad group 2PZ may not be limited, and a substantially small difference may be ensured. In one embodiment, the difference may be within ten. In practical applications, the quantity of input pads in the display panel may be designed according to the product design requirements.

In one embodiment, referring to FIG. 3, along the direction from the first-input pad group 1PZ to the second-input pad group 2PZ, starting from adjacent first-input pad 1P and second-input pad 2P, the first spacing 1H1, 1H2, 1H3, . . . , 1HM may successively change in an arithmetic progression, and at the same time, the second spacing 2H1, 2H2, 2H3, . . . , 2HM may successively and gradually increase. In view of this, the spacing of the plurality of input pads close to the first end side may successively, gradually and uniformly change. Because the substrate for carrying the input pads is a same substrate, the substrate may be substantially uniformly expanded when being heated to expand. When the first spacing changes in an arithmetic progression, the thermally expanded first spacing on the first end side of the input pads may be obtained by scaling the pre-expanded first spacing. In the bonding process, when the input pads close to the second end side cannot be well matched with the output pads, the input pads close to the first end side may be adjusted to be aligned and matched with the output pads, to achieve the one-to-one correspondence between the input pads and the output pads.

In another embodiment, referring to FIG. 3, along the direction from the first-input pad group to the second-input pad group, starting from adjacent first-input and second-input pads, the second spacing 2H1, 2H2, 2H3, . . . , 2HM may successively change in an arithmetic progression, and at the same time, the first spacing 1H1, 1H2, 1H3, . . . , 1HM may successively and gradually increase. In view of this, the spacing of the plurality of input pads close to the second end side may successively, gradually and uniformly change. When the second spacing changes in an arithmetic progression, the thermally expanded second spacing on the second end side of the input pads may be obtained by scaling the pre-expanded second spacing. In the bonding process, when the input pads close to the first end side cannot be well matched with the output pads, the input pads close to the second end side may be adjusted to be aligned and matched with the output pads, to achieve the one-to-one correspondence between the input pads and the output pads.

In one embodiment, referring to FIG. 3, along the direction from the first-input pad group to the second-input pad group, starting from adjacent first-input and second-input pads, the first spacing 1H1, 1H2, 1H3, . . . , 1HM and the second spacing 2H1, 2H2, 2H3, . . . , 2HM may successively change in an arithmetic progression. In view of this, the spacing of the plurality of input pads close to the first end side and the spacing of the plurality of input pads close to the second end side may successively, gradually and uniformly change. Thus, in the bonding process, the thermally expanded spacing between the input pads may be obtained by scaling the pre-expanded spacing. In the bonding process, the one-to-one correspondence between the input pads and the output pads may be realized by adjusting the up, down, left and right movement of the output pads with respect to the input pads.

Figure 7:
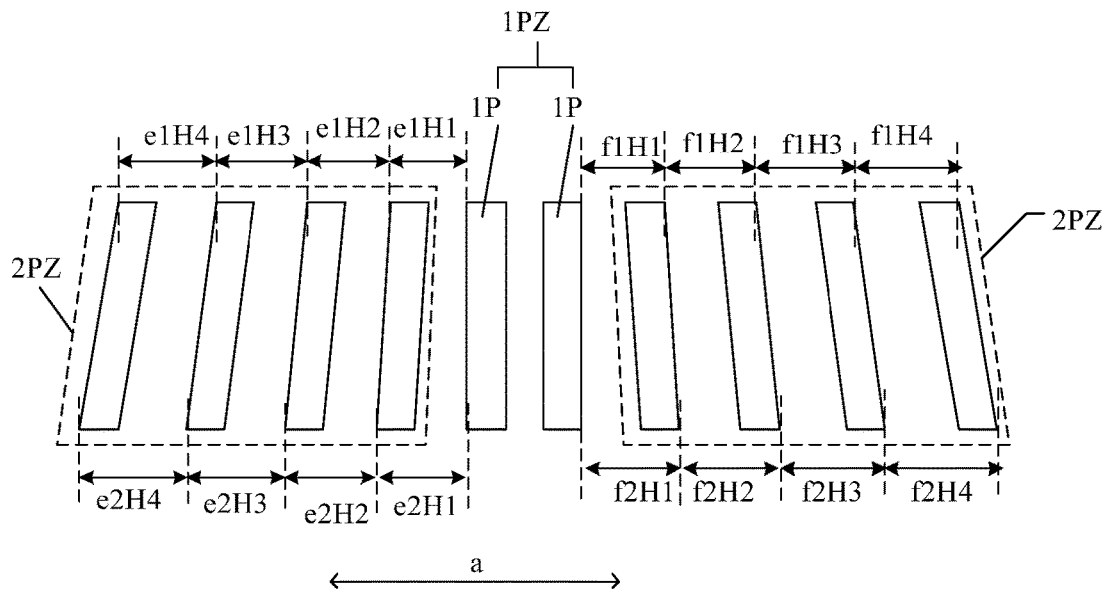
FIG. 7 illustrates a schematic diagram of a local structure of another exemplary display panel consistent with disclosed embodiments of the present disclosure.

FIG. 7 illustrates a schematic diagram of a local structure of a display panel consistent with disclosed embodiments of the present disclosure. The quantity of input pads in FIG. 7 is merely a schematic representation for illustrative purposes. In one embodiment, referring to FIG. 7, in the first direction 'a', along the direction from the first-input pad group 1PZ to the second-input pad group 2PZ disposed on one side of the first-input pad group 1PZ, starting from adjacent first-input pad 1P and second-input pad 2P, the first spacing may successively include e1H1, e1H2, e1H3, and e1H4, and may change in a first arithmetic progression; and the second spacing may successively include e2H1, e2H2, e2H3, and e2H4, and may change in a second arithmetic progression.

In the first direction 'a', along the direction from the first-input pad group 1PZ to the second-input pad group 2PZ disposed on the other side of the first-input pad group 1PZ, starting from adjacent first-input pad 1P and second-input pad 2P, the first spacing may successively include f1H1, f1H2, f1H3, and f1H4, and may change in a third arithmetic progression; the second spacing may successively include f2H1, f2H2, f2H3, and f2H4, and may change in a fourth arithmetic progression.

In the disclosed embodiments, the first spacing and the second spacing between the input pads disposed on both sides of the first-input pad group may change in an arithmetic progression. Thus, along the direction from the first-input pad disposed in the middle to the outside second-input pad, the spacing may successively, gradually and uniformly increase, and the interval distance between adjacent two input pads may also gradually change along the extension direction of the input pad. Moreover, the thermally expanded spacing variation of the input pads in the disclosed display panel may match the thermally expanded spacing variation of the output pads in the flexible circuit board, which may substantially match the material and process tolerances in the bonding process, effectively reduce the misalignment between the input pads and the output pads, and improve the bonding yield. Further, in the disclosed embodiments, the spacing may regularly change, and it may be substantially simple to design the process parameters for fabricating the display panel. The first arithmetic progression, the second arithmetic progression, the third arithmetic progression, and the fourth arithmetic progression may be different arithmetic progressions, respectively.

Figure 8:
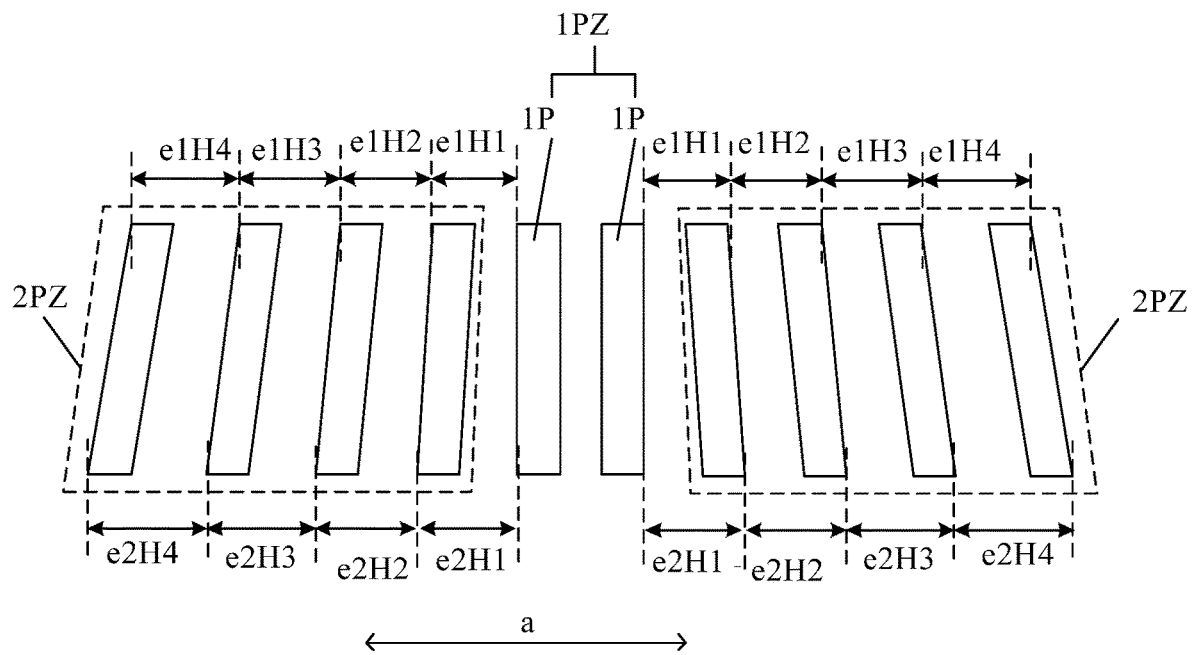
FIG. 8 illustrates a schematic diagram of a local structure of another exemplary display panel consistent with disclosed embodiments of the present disclosure.

FIG. 8 illustrates a schematic diagram of a local structure of another display panel consistent with disclosed embodiments of the present disclosure. The quantity of input pads in FIG. 8 is merely a schematic representation for illustrative purposes. In one embodiment, referring to FIG. 8, the first arithmetic progression and the third arithmetic progression may be a same progression. The first spacing on both sides of the first-input pad group may successively include e1H1, e1H2, e1H3, and e1H4 as an example. The second arithmetic progression and the fourth arithmetic progression may be a same progression. The second spacing on both sides of the first-input pad group may successively include e2H1, e2H2, e2H3, and e2H4 as an example.

In one embodiment, the first spacing in the two second-input pad groups disposed on both sides of the first-input pad group may change in a same manner, and the second spacing thereof may change in a same manner. In other words, the two second-input pad groups may be symmetric with respect to the first-input pad group. In the process of bonding the display panel to the flexible circuit board, the one-to-one correspondence between the input pads and the output pads may be realized by adjusting the relative position of the flexible circuit board with respect to the display panel, i.e., up, down, left and right movement of the output pads with respect to the input pads. Thus, the material and process tolerances in the bonding process may be substantially matched, the misalignment between the input pads and the output pads may be effectively reduced, and the bonding yield may be improved. In addition, the input pads in the disclosed embodiments may be symmetrically designed, and the design of the fabrication process parameters may be substantially simple.

Figure 9:
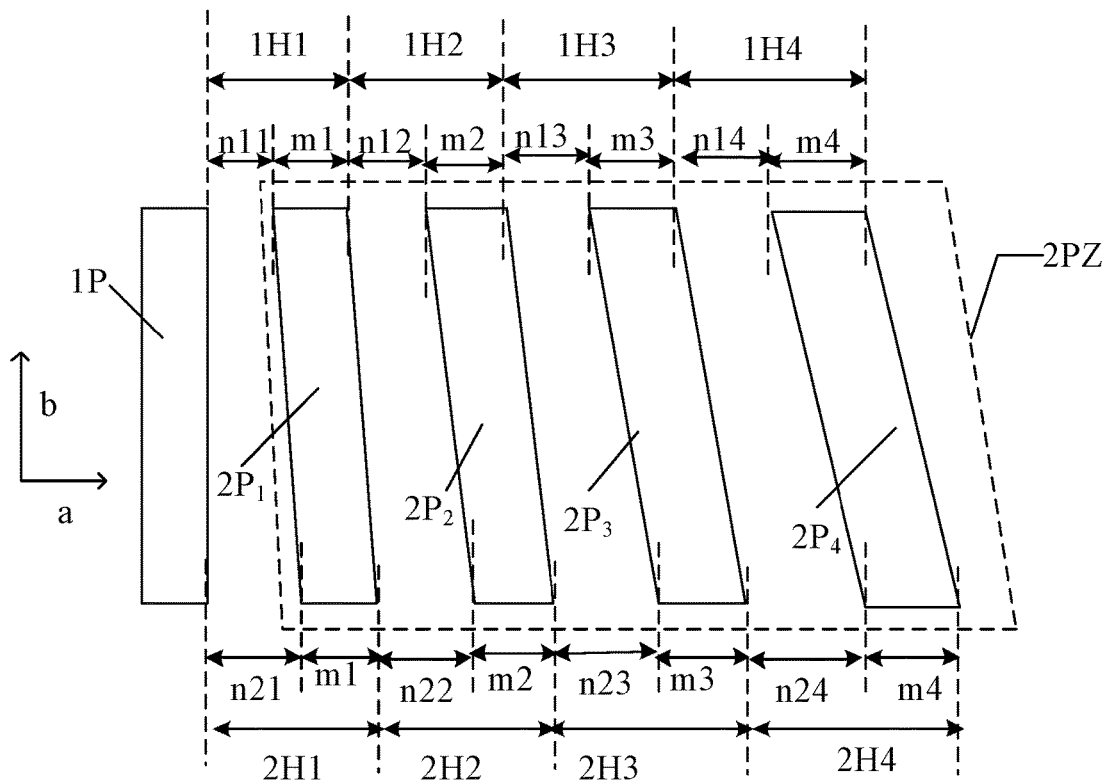
FIG. 9 illustrates a schematic diagram illustrating a change in spacing between input pads in another exemplary display panel consistent with disclosed embodiments of the present disclosure.

In one embodiment, in the first direction, along the direction from the first-input pad group to the second-input pad group, the width of the second-input pad in the first direction may gradually increase. FIG. 9 illustrates another schematic diagram illustrating a change in spacing between input pads in the disclosed display panel. Referring to FIG. 9, a portion of the second-input pads 2P in the second-input pad group may successively include a first second-input pad 2P1, a second second-input pad 2P2, a third second-input pad 2P3, and a fourth second-input pad 2P4. The first spacing 1H may successively include 1H1, 1H2, 1H3, and 1H4, where 1H1<1H2<1H3<1H4. Correspondingly, the second spacing 2H may successively include 2H1, 2H2, 2H3, and 2H4, where 2H1<2H2<2H3<2H4. For illustrative purposes, the width at any position of a single one second-input pad 2P in the first direction 'a' may be equal. The widths of the second-input pads 2P in the first direction may successively include m1, m2, m3 and m4, where m1<m2<m3<m4. The interval distances between adjacent two first ends may successively include n11, n12, n13, and n14, which may gradually increase. The interval distances between adjacent two second ends may successively include n21, n22, n23, and n24, which may gradually increase.

In the disclosed embodiments, along the direction from the first-input pad disposed in the middle to the outside second-input pad, the spacing may successively and gradually increase, and the spacing between adjacent two input pads in the extension direction of the input pad may gradually change. The spacing variation of the thermally expanded input pads in the disclosed display panel may match the spacing variation of the thermally expanded output pads in the flexible circuit board, which may substantially match the material and process tolerances in the bonding process. At the same time, the width of the second-input pad in the first direction may gradually increase, 1H1 and 1H2 illustrated in FIG. 9 are used as an example for illustrative purposes, 1H2>1H1. In the disclosed embodiments, n12>n11, and m2>m1. In other words, the increased value of 1H2 compared to 1H1 may be distributed on the interval distance between the input pads and the width of the input pad, respectively. In other words, the interval distance between the input pads may increase, and the width of the input pad may increase. Thus, the area of the second-input pad may increase to further ensure the performance and reliability of the bonding connection.

In one embodiment, in adjacent two input pads, the width of the input pad in the first direction is m, the interval distance between adjacent two input pads in the first direction is n, and the spacing between adjacent two input pads P is d, where d=m+n, and $0.3 \leq n/d \leq 0.6$. The width at any position of a single one input pad P in the first direction may be the same or different. The definition of the width of the input pad in the first direction and the definition of the interval distance between adjacent two input pads may refer to the corresponding descriptions in disclosed embodiments associated with FIG. 1. The interval distance between adjacent two input pads at different positions of corresponding two input pads in the first direction may be the same or different.

In the disclosed embodiments, the interval distance and the spacing between the input pads may be set to satisfy a certain range of ratios. In the disclosed embodiments, when setting the size of the spacing (first spacing or second spacing) between adjacent two input pads, 1H1 and 1H2 illustrated in FIG. 9, where 1H2>1H1, are used as an example for illustrative purposes, in one embodiment, n11>n12 and m1=m2; in another embodiment, n11>n12 and m1>m2. In other words, the increased value of 1H2 compared to 1H1 may be distributed on the interval distance between the input pads and the width of the input pad, respectively. In other words, the interval distance between the input pads may increase, and the width of the input pad may increase. In view of this, the interval distance between input pads and the width of the input pad may be adjusted according to the above range. The short-circuit between adjacent two input pads caused by too small interval distance may be prevented, and at the same time, the too large overall width occupied by total input pads in the first direction caused by too large interval distance may be prevented. Further, the area occupied by the input pads in the display panel may be prevented from being too large, and the area of the non-display region may be prevented from increasing.

In one embodiment, 20 µm≤d≤30 µm. The display panel in the disclosed embodiments may be applicable to a small-sized display device. In one embodiment, the width of the input pad in the first direction may be 12 µm≤m≤14 µm, and the spacing between the input pads may be 26 µm≤1H≤30 µm, and 25.5 µm≤2 H≤29.5 µm. When setting the size of the input pad and the interval distance between the input pads in the display panel, along the direction from the first-input pad group to the second-input pad group, starting from adjacent first-input and second-input pads, the first spacing 1H may successively and gradually increase, and the second spacing 2H may successively and gradually increase. Thus, in the bonding process, the input pads in the disclosed embodiments may have an overall spacing variation trend in the expanded state consistent with the overall spacing variation trend before expansion, and the one-to-one correspondence between the input pads and the output pads may be realized by up, down, left and right movement of the output pads with respect to the input pads.

In another embodiment, 50 µm≤d≤100 µm. The display panel in the disclosed embodiments may be applicable to a large-sized display device. In one embodiment, the width of the input pad in the first direction may be 20 µm≤m≤26 µm, and the spacing between the input pads may be 50 µm≤1H≤100 µm, and 50 µm≤2 H≤100 µm. When setting the size of the input pad and the interval distance between the input pads in the display panel, along the direction from the first-input pad group to the second-input pad group, starting from adjacent first-input and second-input pads, the first spacing 1H may successively and gradually increase, and the second spacing 2H may successively and gradually increase. Thus, in the bonding process, the input pads in the disclosed embodiments may have an overall spacing variation trend in the expanded state consistent with the overall spacing variation trend before expansion, and the one-to-one correspondence between the input pads and the output pads may be realized by up, down, left and right movement of the output pads with respect to the input pads.

Figure 10:
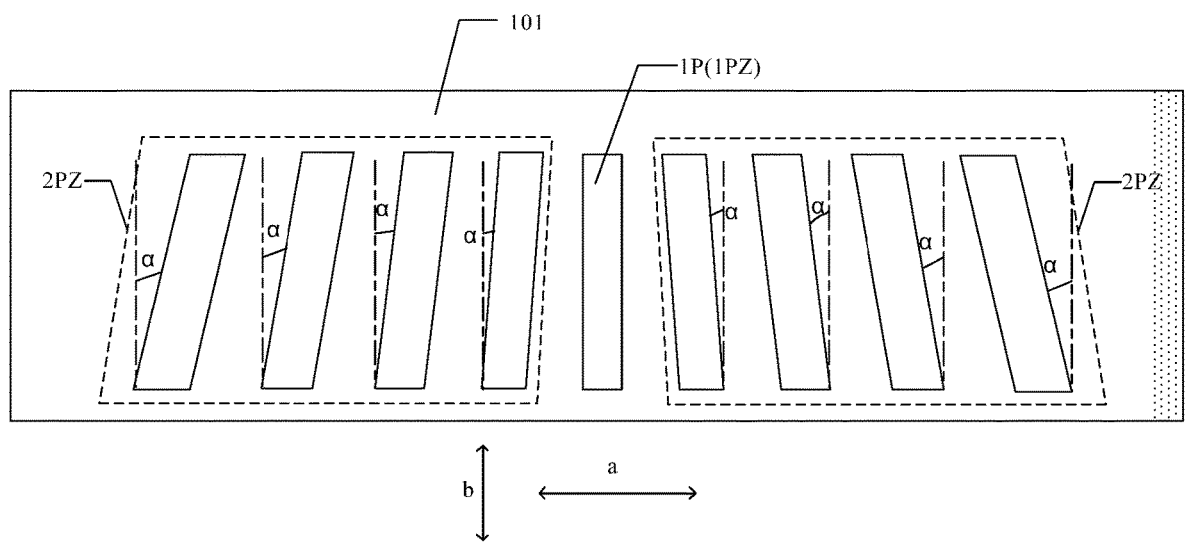
FIG. 10 illustrates a schematic diagram of a local structure of another exemplary display panel consistent with disclosed embodiments of the present disclosure.

FIG. 10 illustrates a schematic diagram of a local structure of another display panel consistent with disclosed embodiments of the present disclosure. In one embodiment, referring to FIG. 10, an acute angle formed between the extension direction of the second-input pad 2P and the second direction 'b' may be α. In the first direction 'a', along the direction from the first-input pad group 1PZ to the second-input pad group 2PZ, α may gradually increase. In the disclosed embodiments, the second-input pads disposed on both sides of the first-input pad group may be successively and gradually expanded in a Chinese character-eight shape outwardly in a direction away from the first-input pad group, and the material and process tolerances in the bonding process may be substantially matched.

In one embodiment, 0°<α≤20°. Further, in another embodiment, 0°<α≤10°. The value of α may satisfy a certain range, and may be prevented from being too large. When α is set too large, in a case where a quantity of the input pads required to be set is constant, the overall width occupied by total input pads in the first direction 'a' may be substantially large, and the area occupied by the input pads in the display panel may be substantially large. The input pads may often be disposed in a non-display region of the display panel, and, thus, the area of the non-display region of the display panel may increase.

Figure 11:
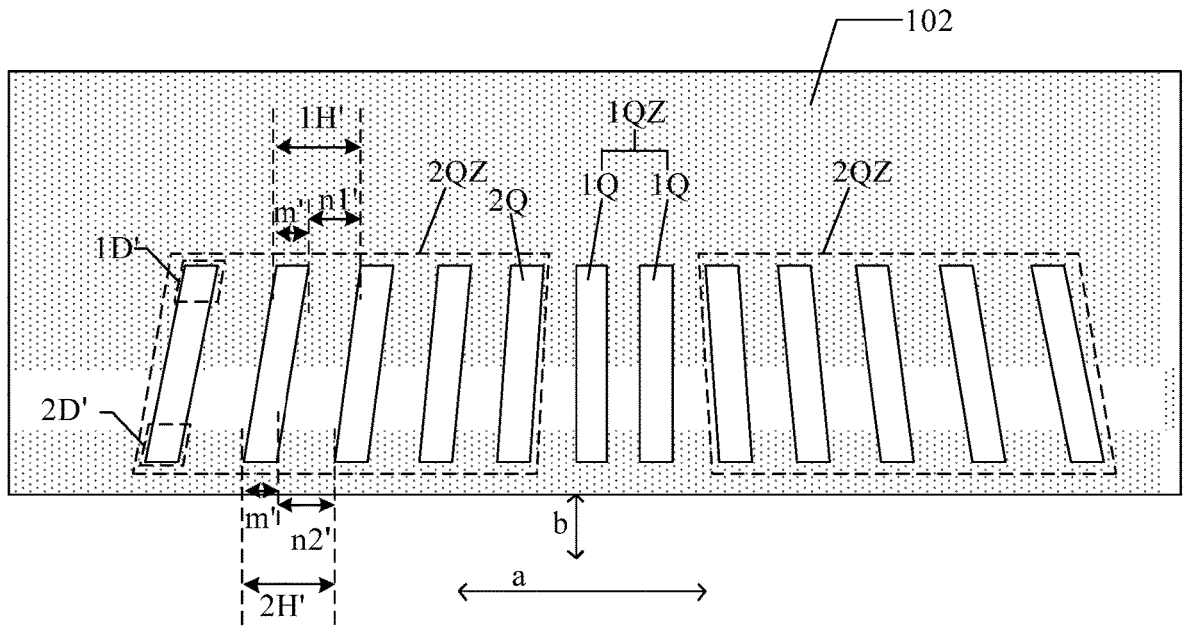
FIG. 11 illustrates a schematic diagram of a local structure of an exemplary flexible circuit board consistent with disclosed embodiments of the present disclosure.

The present disclosure also provides a flexible circuit board. FIG. 11 illustrates a schematic diagram of a local structure of a flexible circuit board consistent with disclosed embodiments of the present disclosure. Referring to FIG. 11, the flexible circuit board may include a base 102 and at least one row of a plurality of output pads Q arranged along the first direction 'a' disposed on a side of the base 102. FIG. 11 illustrates one row of output pads Q for illustrative purposes. In certain embodiments, two rows of output pads Q or a plurality of rows of output pads Q may be disposed on a side of the base 102.

The output pads Q may include at least one first-output pad 1Q and a plurality of second-output pads 2Q. The first-output pad 1Q may be extended along the second direction and the second direction 'b' may intersect the first direction 'a'. At least one first-output pad 1Q may form a first-output pad group 1QZ. Second-output pads 2Q disposed on one side of the first-output pad group 1QZ may form a second-output pad group 2QZ, and two second-output pad groups 2QZ may be disposed on both sides of the first-output pad group 1QZ, respectively. A quantity of the first-output pads 1Q and a quantity of the second-output pads 2Q illustrated in FIG. 1 are merely schematic representations for illustrative purposes.

Each output pad Q may include a first end 1D' and a second end 2D' that are oppositely disposed in respective extension direction. A spacing between any adjacent two output pads Q may include a first spacing 1H' and a second spacing 2H'. The first spacing 1H' may be a spacing of two first ends 1D' of adjacent two output pads Q in the first direction 'a', and the second spacing 2H' may be a spacing of two second ends 2D' of adjacent two output pads Q in the first direction 'a'. In any one second-output pad group 2QZ, the first spacing 1H' and the second spacing 2H' between adjacent two second-output pads 2Q may not be equal.

FIG. 11 illustrates one method for calculating the spacing between adjacent two output pads Q for illustrative purposes. The spacing between two output pads Q may be defined as a sum of a width of one output pad Q along the first direction 'a' and an interval distance between the two output pads Q along the first direction 'a'. In other words, 1H'=m'+n1', where m' is the width of one output pad Q along the first direction 'a', and n1' is an interval distance between two first ends 1D' along the first direction 'a'. Similarly, 2H'=m'+n2', where m' is the width of one output pad Q along the first direction 'a', and n2' is an interval distance between two second ends 2D' along the first direction 'a'. In certain embodiments, another calculation method may refer to corresponding descriptions in the above disclosed embodiments of the display panel associated with FIG. 2, which is not repeated herein.

In the first direction 'a', along the direction from the first-output pad group 1QZ to the second-output pad group 2QZ, starting from adjacent first-output pad 1Q and second-output pad 2Q, the first spacing 1H' may successively and gradually increase, and the second spacing 2H' may successively and gradually increase. The schematic of spacing variation may refer to corresponding descriptions in the above disclosed embodiments of the display panel associated with FIG. 3, which is not repeated herein.

When the disclosed flexible circuit board is bonded to a display panel, the input pads may be aligned and bonded to the output pads in a one-to-one correspondence by adjusting relative positions of the input pads in the display panel with respect to the output pads in the flexible circuit board. The alignment adjustment principle between the output pads and the input pads may refer to corresponding descriptions in the above disclosed embodiments of the display panel associated with FIG. 4 and FIG. 5, which is not repeated herein.

In the disclosed embodiments, along the direction from the first-output pad disposed in the middle to the outside second-output pad, the spacing may successively and gradually increase, and the interval distance between adjacent two output pads may gradually change along the extension direction of the output pad. The second-output pads may be gradually expanded outwardly with respect to the first-output pad, and the output pads may be substantially uniformly expanded as the base of the flexible circuit board is thermally expanded. In other words, the output pads in the disclosed embodiments may have an overall spacing variation trend in the expanded state consistent with the overall spacing variation trend before expansion.

In the process of bonding the display panel to the flexible circuit board, the one-to-one correspondence between the input pads and the output pads may be realized by adjusting the relative position of the flexible circuit board with respect to the display panel, i.e., up, down, left and right movement of the output pads with respect to the input pads. The spacing variation of the thermally expanded output pads in the disclosed flexible circuit board may match the spacing variation of the thermally expanded input pads in the display panel, which may substantially match the material and process tolerances in the bonding process, effectively reduce the misalignment between the input pads and the output pads, and improve the bonding yield.

For illustrative purposes, the second-output pads disposed on both sides of the first-output pad group in FIG. 11 and the following drawings are arranged in a regular Chinese character-eight shape as an example. The second-output pads disposed on both sides of the first-output pad group in the disclosed flexible circuit board may also be arranged in an inverted Chinese character-eight shape, which is not illustrated in the drawings.

In one embodiment, in the disclosed flexible circuit board, each second-output pad group disposed on both sides of the first-output pad group may have a same quantity of the second-output pads. In other words, the second-output pads having a same quantity may be disposed on both sides of the first-output pad group. In view of such design, when performing the alignment between the input pads and the output pads, the first-input pad extended in the second direction may often be easily aligned with the first-output pad extended in the second direction. Because the second-output pads are arranged in a Chinese character-eight shape, when being aligned with the second-input pads that are also arranged in a Chinese character-eight shape, the second-output pads disposed on both sides of the first-output pad may be simultaneously aligned with the second-input pads disposed on both sides of the first-input pad, which may ensure a substantially large quantity of alignment reference positions, and may ensure a substantially high alignment accuracy. In other words, two pairs of second-output pads and second-input pads, and the first-output pad and the first-input pad may be reference positions, and the alignment may be completed when the two pairs of second-output pads and second-input pads as well as the first-output pad and the first-input pad are accurate.

In another embodiment, each second-output pad group may have a different quantity of the second-output pads. The difference between the quantities of the second-output pads in the two second-output pad groups may not be limited, as long as the difference may not be too large. In practical applications, the difference may be set according to the quantity of input pads in the display panel to be bonded.

In one embodiment, in the first direction, along the direction from the first-output pad group to the second-output pad group, starting from adjacent first-output and second-output pads, the first spacing may successively change in an arithmetic progression. Because the base for carrying the output pads is a same base, the base may be substantially uniformly expanded when being heated to expand. When the first spacing changes in an arithmetic progression, the thermally expanded first spacing on the first end side of the output pads may be obtained by scaling the pre-expanded first spacing. In the bonding process, when the output pads close to the second end side cannot be well matched with the input pads, the output pads close to the first end side may be adjusted to be aligned and matched with the input pads, to achieve the one-to-one correspondence between the output pads and the input pads.

In another embodiment, in the first direction, along the direction from the first-output pad group to the second-output pad group, starting from adjacent first-output and second-output pads, the second spacing may successively change in an arithmetic progression. When the second spacing changes in an arithmetic progression, the thermally expanded second spacing on the second end side of the output pads may be obtained by scaling the pre-expanded second spacing. In the bonding process, when the output pads close to the first end side cannot be well matched with the input pads, the output pads close to the second end side may be adjusted to be aligned and matched with the input pads, to achieve the one-to-one correspondence between the input pads and the output pads.

In one embodiment, in the first direction, along the direction from the first-output pad group to the second-output pad group, starting from adjacent first-output and second-output pads, the first spacing may change in an arithmetic progression, and the second spacing may change in an arithmetic progression. Thus, in the bonding process, the thermally expanded spacing between the output pads may be obtained by scaling the pre-expanded spacing. In the bonding process, the one-to-one correspondence between the output pads and the output pads may be realized through the up, down, left and right movement of the output pads with respect to the input pads.

Figure 12:
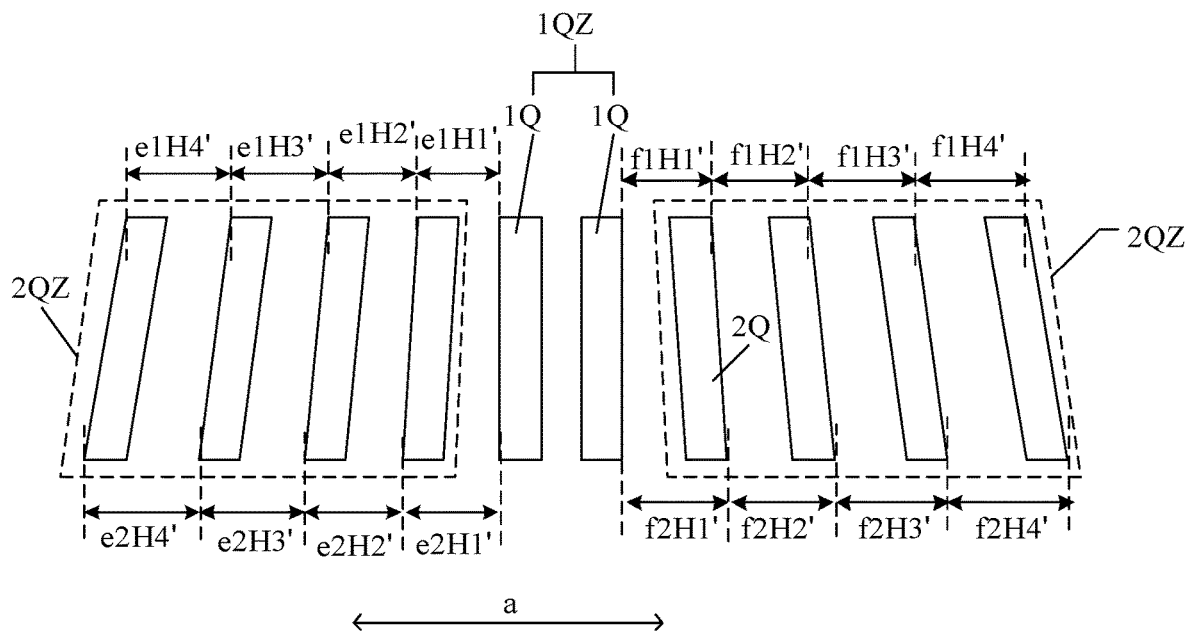
FIG. 12 illustrates a schematic diagram of a local structure of another exemplary flexible circuit board consistent with disclosed embodiments of the present disclosure.

FIG. 12 illustrates a schematic diagram of a local structure of another flexible circuit board consistent with disclosed embodiments of the present disclosure. In one embodiment, referring to FIG. 12, in the first direction 'a', along the direction from the first-output pad group 1QZ to the second-output pad group 2QZ disposed on one side of the first-output pad group, starting from adjacent first-output pad 1Q and second-output pad 2Q, the first spacing may successively include e1H1', e1H2', e1H3', and e1H4', and may change in a third arithmetic progression; and the second spacing may successively include e2H1', e2H2', e2H3', and e2H4', and may change in a fourth arithmetic progression.

In the first direction 'a', along the direction from the first-output pad group 1QZ to the second-output pad group 2QZ disposed on the other side of the first-output pad group, starting from adjacent first-output pad 1Q and second-output pad 2Q, the first spacing may successively include f1H1', f1H2', f1H3', and f1H4', and may change in a third arithmetic progression; the second spacing may successively include f2H1', f2H2', f2H3', and f2H4', and may change in a fourth arithmetic progression.

In the disclosed embodiments, the first spacing and the second spacing between the output pads disposed on both sides of the first-output pad group may change in an arithmetic progression. Thus, along the direction from the first-output pad disposed in the middle to the outside second-output pad, the spacing may successively, gradually and uniformly increase, and the interval distance between adjacent two output pads may also gradually change along the extension direction of the output pad. Moreover, the thermally expanded spacing variation of the output pads in the disclosed flexible circuit board may match the thermally expanded spacing variation of the input pads in the display panel, which may substantially match the material and process tolerances in the bonding process, effectively reduce the misalignment between the output pads and the input pads, and improve the bonding yield. Further, in the disclosed embodiments, the spacing may regularly change, and it may be substantially simple to design the process parameters for fabricating the flexible circuit board. The first arithmetic progression, the second arithmetic progression, the third arithmetic progression, and the fourth arithmetic progression may be different arithmetic progressions, respectively.

In one embodiment, the first arithmetic progression and the third arithmetic progression may be a same progression, and the second arithmetic progression and the fourth arithmetic progression may be a same progression. In the disclosed embodiments, the first spacing in the two second-output pad group disposed on both sides of the first-output pad group may change in a same manner, and the second spacing thereof may change in a same manner. In other words, the two second-output pad groups may be symmetric with respect to the first-output pad group. In the process of bonding the display panel to the flexible circuit board, the one-to-one correspondence between the input pads and the output pads may be realized through up, down, left and right movement of the output pads with respect to the input pads. In addition, the output pads in the disclosed embodiments may be symmetrically designed, and the design of the fabrication process parameters may be substantially simple.

Figure 13:
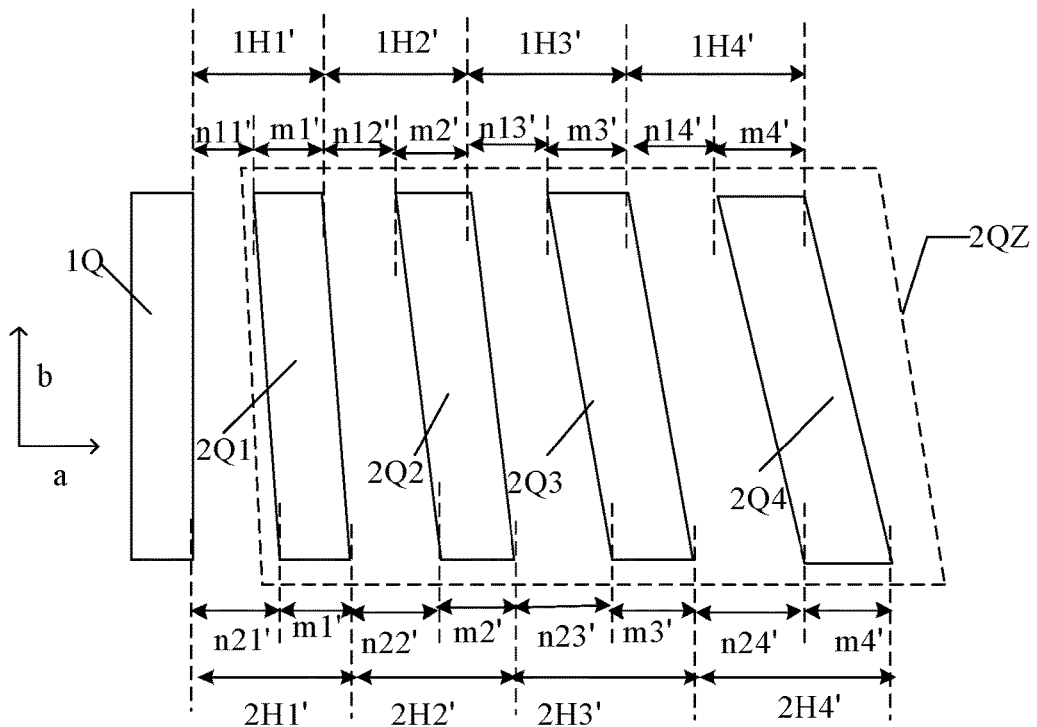
FIG. 13 illustrates a schematic diagram illustrating a change in spacing between output pads in an exemplary flexible circuit board consistent with disclosed embodiments of the present disclosure.

In one embodiment, in the first direction, along the direction from the first-output pad group to the second-output pad group, the width of the second-output pad in the first direction may successively and gradually increase. FIG. 13 illustrates a schematic diagram illustrating a change in spacing between output pads in the disclosed flexible circuit board. Referring to FIG. 13, a portion of the second-output pads 2Q in the second-output pad group may successively include a first second-output pad 2Q1, a second second-output pad 2Q2, a third second-output pad 2Q3, and a fourth second-output pad 2Q4. The first spacing 1H' may successively include 1H1', 1H2', 1H3', and 1H4', where 1H1'<1H2'<1H3'<1H4'. Correspondingly, the second spacing 2H' may successively include 2H1 2H2', 2H3', and 2H4', where 2H1'<2H2'<2H3'<2H4'. For illustrative purposes, the width at any position of a single one second-output pad 2Q in the first direction 'a' may be equal. The widths of the second-output pads 2Q in the first direction may successively include m1', m2', m3' and m4', where m1'<m2'<m3'<m4'. The interval distances between adjacent two first ends may successively include n11', n12', n13', and n14', which may successively and gradually increase. The interval distances between adjacent two second ends may successively include n21', n22', n23', and n24', which may successively and gradually increase.

In the disclosed flexible circuit board, along the direction from the first-output pad disposed in the middle to the outside second-output pad, the spacing may successively and gradually increase, and the interval distance between adjacent two output pads in the extension direction of the output pad may gradually change. The spacing variation of the thermally expanded output pads in the disclosed flexible circuit board may match the spacing variation of the thermally expanded input pads in the display panel, which may substantially match the material and process tolerances in the bonding process. At the same time, the width of the second-output pad in the first direction may successively and gradually increase, 1H1' and 1H2' illustrated in FIG. 13, where 1H2'>1H1', are used as an example for illustrative purposes. In the disclosed embodiments, n12'>n11', and m2'>m1'. In other words, the increased value of 1H2' compared to 1H1' may be distributed on the interval distance between the output pads and the width of the output pad, respectively. In other words, the interval distance between the output pads may increase, and the width of the output pad may increase. Thus, the area of the second-output pad may increase to further ensure the performance and reliability of the bonding connection.

In one embodiment, in adjacent two output pads, the width of the output pad in the first direction is m', the interval distance between adjacent two output pads in the first direction is n', and the spacing between adjacent two output pads is d', where d'=m'+n', and $0.3 \leq n'/d' \leq 0.6$. The definition of the width of the output pad in the first direction and the definition of the interval distance between adjacent two output pads may refer to the corresponding descriptions in the disclosed embodiments associated with FIG. 11. The interval distance between adjacent two output pads in the first direction at different positions corresponding to two output pads may be the same or different.

In the disclosed embodiments, the interval distance and the spacing between the output pads may be set to satisfy a certain range of ratios. In the disclosed embodiments, when setting the size of the spacing (first spacing or second spacing) between adjacent two output pads, 1H1' and 1H2' illustrated in FIG. 13, where 1H2'>1H1', are used as an example for illustrative purposes, in one embodiment, n11'>n12' and m1'=m2'; in another embodiment, n11'>n12' and m1'>m2'. In other words, the increased value of 1H2' compared to 1H1' may be distributed on the interval distance between the output pads and the width of the output pad, respectively. In other words, the interval distance between the output pads may increase, and the width of the output pad may increase. In view of this, the interval distance between output pads and the width of the output pad may be adjusted according to the above range. The short-circuit between adjacent two output pads caused by too small interval distance may be prevented, and at the same time, the too large overall width occupied by total output pads in the first direction caused by too large interval distance may be prevented. Further, the overall width of the flexible circuit board in the first direction may be prevented from being too large to exceed a preset size.

In one embodiment, $20 \mu m \leq d' \leq 30 \mu m$. The flexible circuit board in the disclosed embodiments may be applicable to a small-sized display device. In one embodiment, the width of the output pad in the first direction may be $12 \mu m \leq m' \leq 14 \mu m$, and the spacing between the output pads may be $26 \mu m \leq 1H' \leq 30 \mu m$, and $25.5 \mu m \leq 2 H' \leq 29.5 \mu m$.

In another embodiment, $50 \mu m \leq d' \leq 100 \mu m$. The flexible circuit board in the disclosed embodiments may be applicable to a large-sized display device. In one embodiment, the width of the output pad in the first direction may be 20

μm≤m'≤26 μm, and the spacing between the output pads may be 50 μm≤1H'≤100 μm, and 50 μm≤2 H'≤100 μm.

Figure 14:
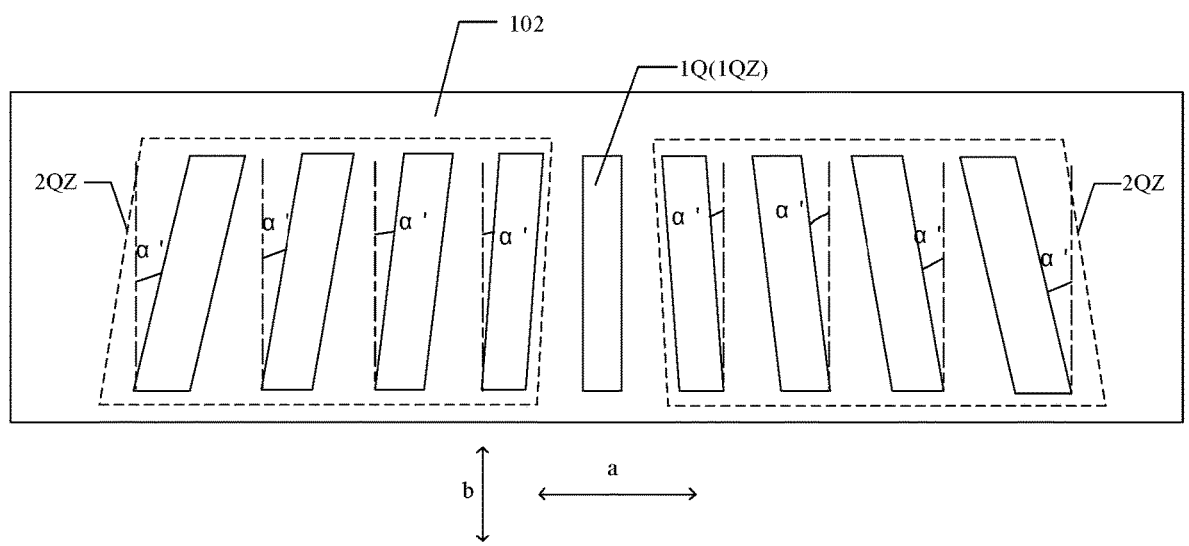
FIG. 14 illustrates a schematic diagram of a local structure of another exemplary flexible circuit board consistent with disclosed embodiments of the present disclosure.

FIG. 14 illustrates a schematic diagram of a local structure of another flexible circuit board consistent with disclosed embodiments of the present disclosure. In one embodiment, referring to FIG. 14, an acute angle formed between the extension direction of the second-output pad 2Q and the second direction is α'. In the first direction 'a', along the direction from the first-output pad group 1QZ to the second-output pad group 2QZ, α' may gradually increase. In one embodiment, 0°<α'≤20°. Further, in another embodiment, 0°<α'≤10°.

In the disclosed embodiments, the second-output pads disposed on both sides of the first-output pad group may be successively and gradually expanded outwardly in a Chinese character-eight shape in a direction away from the first-output pad group, and the one-to-one correspondence between the input pads and the output pads may be realized through up, down, left and right movement of the output pads with respect to the input pads. The value of α' may satisfy a certain range, and may be prevented from being too large. When α' is set too large, in a case where a quantity of the output pads required to be set is constant, the overall width occupied by total output pads in the first direction 'a' may be substantially large, the area occupied by the output pads in the base of the flexible circuit board may be substantially large, and the size of the flexible circuit board may increase.

Figure 15:
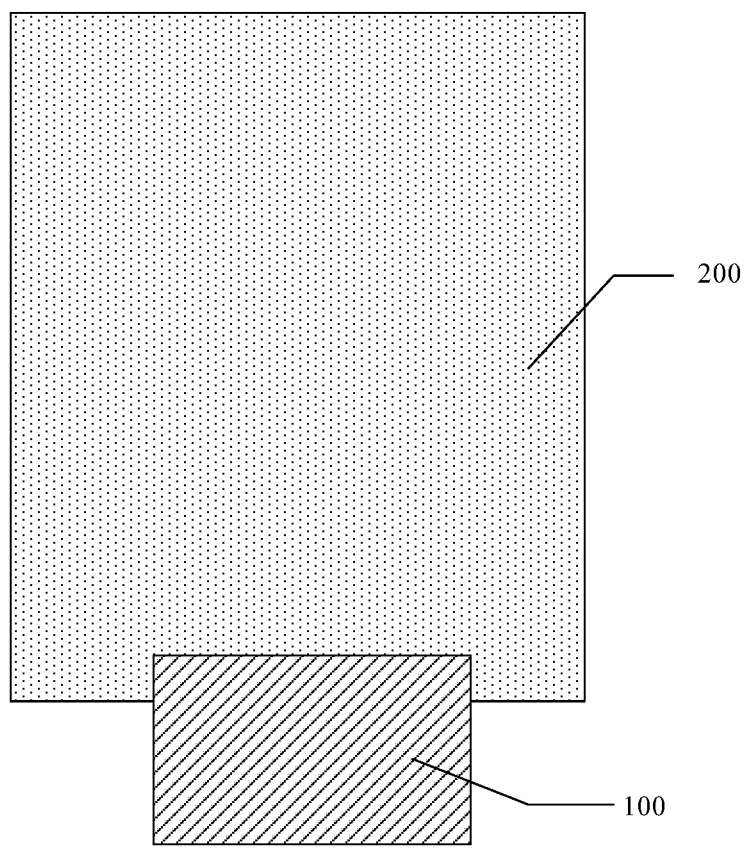
FIG. 15 illustrates a schematic diagram of an exemplary display device consistent with disclosed embodiments of the present disclosure.

The present disclosure further provides a display device. FIG. 15 illustrates a schematic diagram of a display device consistent with disclosed embodiments of the present disclosure. Referring to FIG. 15, the display device may include a display panel 200 and a flexible circuit board 100. The display panel 200 may be any one of the display panels in the disclosed embodiments. The flexible circuit board 100 may be any one of the flexible circuit boards in the disclosed embodiments. The display panel 200 may include a plurality of input pads, and the flexible circuit board 100 may include a plurality of output pads. An input pad may be bonded and connected to a corresponding output pad. The positions of the input pads and the output pads are not illustrated in FIG. 15.

In the disclosed display panel, the flexible circuit board, and the display device, along the direction from the first-input pad disposed in the middle to the outside second-input pad, the spacing between adjacent two input pads may successively and gradually increase, and the interval distance between adjacent two input pads may gradually change along the extension direction of the input pad. The second-input pads may be successively and gradually expanded outwardly with respect to the first-input pad, and the input pads may be substantially uniformly expanded as the substrate of the display panel is thermally expanded. In other words, the input pads in the disclosed embodiments may have an overall spacing variation trend in the expanded state consistent with the overall spacing variation trend before expansion.

In the process of bonding the display panel to the flexible circuit board, the one-to-one correspondence between the input pads and the output pads may be realized by adjusting the relative position of the flexible circuit board with respect to the display panel, i.e., up, down, left and right movement of the output pads with respect to the input pads. The spacing variation of the thermally expanded input pads in the disclosed display panel may match the spacing variation of the thermally expanded output pads in the flexible circuit board, which may substantially match the material and process tolerances in the bonding process, effectively reduce the misalignment between the input pads and the output pads, and improve the bonding yield.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
a substrate; and
at least one row of a plurality of input pads arranged along a first direction, disposed in a bonding region of the substrate, wherein:
the plurality of input pads includes at least one first-input pad and a plurality of second-input pads, wherein:
a first-input pad of the at least one first-input pad is extended along a second direction, wherein the second direction intersects the first direction,
the at least one first-input pad forms a first-input pad group,
the plurality of second-input pads constitutes second-input pad groups, and two of the second-input pad groups are disposed on both sides of the first-input pad group, respectively,
each input pad of the plurality of input pads includes a first end and a second end that are oppositely disposed in a respective extension direction thereof, and a spacing between any adjacent two input pads of the plurality of input pads includes a first spacing and a second spacing, wherein:
the first spacing is a spacing between two first ends of the adjacent two input pads in the first direction,
the second spacing is a spacing between two second ends of the adjacent two input pads in the first direction, and
in any one second-input pad group, the first spacing and the second spacing between adjacent two second-input pads are not equal, and
in the first direction, along a direction from the first-input pad group to the second-input pad group, starting from adjacent first-input and second-input pads, the first spacing successively and gradually increases, and the second spacing successively and gradually increases,
the input pads are arranged in such a way that, in a process of bonding the display panel to a flexible circuit board having a plurality of output pads with a one-to-one correspondence between the input pads and the output pads, a spacing variation of the input pads matches a spacing variation of the output pads in the flexible circuit board, and the first-input pad group is configured as a center for alignment between the input pads of the display panel and the output pads of the flexible circuit board, and the second-input pad group is configured to align with corresponding output pads of the flexible circuit board by moving the flexible circuit board up or down.

2. The display panel according to claim 1, wherein:
the two of the second-input pad groups have a different quantity of second-input pads.

3. The display panel according to claim 1, wherein:
the two of the second-input pad groups have a same quantity of second-input pads.

4. The display panel according to claim 3, wherein:
in the first direction, along the direction from the first-input pad group to the second-input pad group, starting from the adjacent first-input and second-input pads, at least one of the first spacing and the second spacing changes in an arithmetic progression.

5. The display panel according to claim 4, wherein:
in the first direction, along the direction from the first-input pad group to the second-input pad group disposed on one side of the first-input pad group, starting from the adjacent first- and second-input pads, the first spacing changes in a first arithmetic progression, and the second spacing changes in a second arithmetic progression; and
in the first direction, along the direction from the first-input pad group to the second-input pad group disposed on another side of the first-input pad group, starting from the adjacent first-input and second-input pads, the first spacing changes in a third arithmetic progression, and the second spacing changes in a fourth arithmetic progression.

6. The display panel according to claim 5, wherein:
the first arithmetic progression and the third arithmetic progression are a same progression; and
the second arithmetic progression and the fourth arithmetic progression are a same progression.

7. The display panel according to claim 1, wherein:
in the first direction, along the direction from the first-input pad group to the second-input pad group, a width of a second-input pad of the plurality of second-input pads in the first direction successively and gradually increases.

8. The display panel according to claim 1, wherein:
in the adjacent two input pads, a width of an input pad of the plurality of input pads in the first direction is m, an interval distance between the adjacent two input pads in the first direction is n, and the spacing between the adjacent two input pads is d, wherein d=m+n, and $0.3 \leq n/d \leq 0.6$.

9. The display panel according to claim 8, wherein:
20 μm≤d≤30 μm.

10. The display panel according to claim 8, wherein:
50 μm≤d≤100 μm.

11. The display panel according to claim 1, wherein:
an acute angle formed between an extension direction of a second-input pad of the plurality of second-input pads and the second direction is α, and
in the first direction, along the direction from the first-input pad group to the second-input pad group, α gradually increases.

12. The display panel according to claim 11, wherein:
$0° < α \leq 20°$.

13. A flexible circuit board, comprising:
a base; and
at least one row of a plurality of output pads arranged along a first direction, disposed on a side of the base, wherein:
the plurality of output pads include at least one first-output pad and a plurality of second-output pads, wherein:
a first-output pad of the at least one first-output pad is extended along a second direction, wherein the second direction intersects the first direction,
the at least one first-output pad forms a first-output pad group,
the plurality of second-output pads constitutes second-output pad groups, and two of the second-output pad groups are disposed on both sides of the first-output pad group, respectively,
each output pad of the plurality of output pads includes a first end and a second end that are oppositely disposed in respective extension direction thereof, and a spacing between any adjacent two output pads of the plurality of output pads includes a first spacing and a second spacing, wherein:
the first spacing is a spacing between two first ends of the adjacent two output pads in the first direction,
the second spacing is a spacing between two second ends of the adjacent two output pads in the first direction, and
in any one second-output pad group, the first spacing and the second spacing between adjacent two second-output pads are not equal, and
in the first direction, along a direction from the first-output pad group to the second-output pad group, starting from adjacent first-output and second-output pads, the first spacing successively and gradually increases, and the second spacing successively and gradually increases,
the output pads are arranged in such a way that, in a process of bonding the flexible circuit board to a display panel having a plurality of input pads with a one-to-one correspondence between the input pads and the output pads, a spacing variation of the output pads matches a spacing variation of the input pads in the display panel, and the first-input pad group is configured as a center for alignment between the input pads of the display panel and the output pads of the flexible circuit board, and the second-input pad group is configured to align with corresponding output pads of the flexible circuit board by moving the flexible circuit board up or down.

14. The flexible circuit board according to claim 13, wherein:
in the first direction, along the direction from the first-output pad group to the second-output pad group, starting from the adjacent first-output and second-output pads, at least one of the first spacing and the second spacing changes in an arithmetic progression.

15. The flexible circuit board according to claim 13, wherein:
in the first direction, along the direction from the first-output pad group to the second-output pad group disposed on one side of the first-output pad group, starting from the adjacent first-output and second-output pads, the first spacing changes in a first arithmetic progression, and the second spacing changes in a second arithmetic progression; and
in the first direction, along the direction from the first-output pad group to the second-output pad group disposed on another side of the first-output pad group, starting from the adjacent first-output and second-output pads, the first spacing changes in a third arithmetic progression, and the second spacing changes in a fourth arithmetic progression.

16. The flexible circuit board according to claim 15, wherein:
the first arithmetic progression and the third arithmetic progression are a same progression; and the second arithmetic progression and the fourth arithmetic progression are a same progression.

17. The flexible circuit board according to claim 13, wherein:
in the first direction, along the direction from the first-output pad group to the second-output pad group, a width of a second-output pad of the plurality of second-output pads in the first direction successively and gradually increases.

18. The flexible circuit board according to claim 13, wherein:
in the adjacent two output pads, a width of an output pad in the first direction is m, an interval distance between the adjacent two output pads in the first direction is n, and the spacing between the adjacent two output pads is d, wherein d=m+n, and $0.3 \leq n/d \leq 0.6$.

19. The flexible circuit board according to claim 13, wherein:
an acute angle formed between an extension direction of a second-output pad of the plurality of second-output pads and the second direction is α,
in the first direction, along the direction from the first-output pad group to the second-output pad group, α gradually increases.

20. A display device, comprising a display panel, wherein the display panel includes:
a substrate; and
at least one row of a plurality of input pads arranged along a first direction, disposed in a bonding region of the substrate, wherein:
the plurality of input pads includes at least one first-input pad and a plurality of second-input pads, wherein:
a first-input pad of the at least one first-input pad is extended along a second direction, wherein the second direction intersects the first direction,
the at least one first-input pad forms a first-input pad group,
the plurality of second-input pads constitutes second-input pad groups, and two of the second-input pad groups are disposed on both sides of the first-input pad group, respectively,
each input pad of the plurality of input pads includes a first end and a second end that are oppositely disposed in a respective extension direction thereof, and a spacing between any adjacent two input pads of the plurality of input pads includes a first spacing and a second spacing, wherein:
the first spacing is a spacing between two first ends of the adjacent two input pads in the first direction,
the second spacing is a spacing between two second ends of the adjacent two input pads in the first direction, and
in any one second-input pad group, the first spacing and the second spacing between adjacent two second-input pads are not equal, and
in the first direction, along a direction from the first-input pad group to the second-input pad group, starting from adjacent first-input and second-input pads, the first spacing successively and gradually increases, and the second spacing successively and gradually increases,
wherein the display device further includes a flexible circuit board bond to the display panel, the flexible board includes a plurality of output pads, the plurality of output pads have a one-to-one correspondence with the plurality of input pads, and a spacing variation of the output pads in the flexible circuit board matches a spacing variation of the input pads in the display panel, and the first-input pad group is configured as a center for alignment between the input pads of the display panel and the output pads of the flexible circuit board, and the second-input pad group is configured to align with corresponding output pads of the flexible circuit board by moving the flexible circuit board up or down.

\* \* \* \* \*